United States Patent
Heuer et al.

(10) Patent No.: US 6,869,697 B2
(45) Date of Patent: *Mar. 22, 2005

(54) ELECTROPHOSPHORESCENT ARRANGEMENT COMPRISING CONDUCTIVE POLYMERS

(75) Inventors: Helmut-Werner Heuer, Krefeld (DE); Rolf Wehrmann, Krefeld (DE)

(73) Assignee: Bayer Aktiengesellschaft, Leverkusen (DE)

(*) Notice: Subject to any disclaimer, the term of this patent is extended or adjusted under 35 U.S.C. 154(b) by 0 days.

This patent is subject to a terminal disclaimer.

(21) Appl. No.: 10/251,597

(22) Filed: Sep. 20, 2002

(65) Prior Publication Data

US 2003/0108769 A1 Jun. 12, 2003

(30) Foreign Application Priority Data

Oct. 16, 2001 (DE) ......................................... 101 50 477

(51) Int. Cl.$^7$ ............................................... H05B 33/12
(52) U.S. Cl. ..................... 428/690; 428/917; 257/40; 257/E51.41; 257/E51.44; 313/504; 313/506
(58) Field of Search ............................... 428/690, 917; 257/40, E51.41, E51.44; 313/503, 504, 506; 252/500

(56) References Cited

U.S. PATENT DOCUMENTS

| | | | |
|---|---|---|---|
| 4,982,014 A | 1/1991 | Freitag et al. | 568/721 |
| 5,126,428 A | 6/1992 | Freitag et al. | 528/196 |
| 5,227,458 A | 7/1993 | Freitag et al. | 528/196 |
| 5,281,489 A | 1/1994 | Mori et al. | 428/690 |
| 5,300,575 A | 4/1994 | Jonas et al. | 525/186 |
| 5,391,472 A | 2/1995 | Muys et al. | 430/527 |
| 5,719,467 A | 2/1998 | Antoniadis et al. | 313/506 |
| 5,766,515 A * | 6/1998 | Jonas et al. | 252/500 |
| 6,157,479 A * | 12/2000 | Heuer et al. | 359/265 |
| 6,225,040 B1 | 5/2001 | Muys et al. | 430/533 |
| 6,312,304 B1 * | 11/2001 | Duthaler et al. | 445/24 |
| 6,323,988 B1 * | 11/2001 | Heuer et al. | 359/265 |
| 6,372,154 B1 * | 4/2002 | Li | 252/301.16 |
| 6,392,250 B1 * | 5/2002 | Aziz et al. | 257/40 |
| 6,403,741 B1 * | 6/2002 | Heuer et al. | 526/256 |
| 6,416,888 B1 * | 7/2002 | Kawamura et al. | 428/690 |
| 6,503,643 B1 * | 1/2003 | Heuer et al. | 428/690 |
| 6,614,175 B2 * | 9/2003 | Aziz et al. | 313/504 |
| 2002/0159127 A1 * | 10/2002 | Wehrmann et al. | 359/245 |

FOREIGN PATENT DOCUMENTS

| | | |
|---|---|---|
| RU | 2123773 | 12/1998 |
| WO | 00/70655 | 11/2000 |
| WO | 00700566 A | 11/2000 |

OTHER PUBLICATIONS

Gustafsson G et al: "Plastic' LED a flexible light–emitting device using a polyanilline transparent electrode" Proceedings of the International Conference in Science and Technology of Synthetic Metals., Part 5 (of 6); Goteborg, Swed Aug. 12–18, 1992, Bd. 57 Nr. 1 part 5, 12. AUG (Aug. 12, 1992), Seiten 4123–4127, XP002231424 Synth Met; Synthetic Metals; Processing of Polymers, Applications, Langmuir–Blodgett Films, Non–Linear Optics, and Polymer Electronics Apr. 12, 1993 Publ by Elsevier Seite 4123–Seite 4125.

Park J–W et al: "Characteristics of organic electroluminescent devices using polypyrrole conducting layer and undoped conjugated polymer layer" Thin Solid Films, Elsevier–Sequoia S.A. Lausanne, CH, Bd. 363, Nr. 1–2, März 2000 (Mar. 2000), Seiten 259–262, XP004189321 ISSN: 0040–6090 Seite 259–Seite 260.

Applied Physics Letters, vol. 75, No. 1, Jul. 5, 1999, M.A. Baldo et al, "Very high–efficiency green organic light–emitting devices based on electrophosphorescence".

Houben–Weyl, 4/1C, date unavailable, pp. 14–102, Prof. Dr. Felix Zymalkowski, "a) Aligemeines".

Houben–Weyl, Methoden der organischen Chemie [Methods of organic chemistry], vol. E 20.

Makromolekulare Stoffe [Macromolecular substrances], Part 2, month unavailable 1987, pp. 1141–1143 Dr. Günter Schröder, "χ) von Acryl–Verbindungen".

Ullmann (4) 13, date unavailable pp. 135–148, Dr. Franz Josef Bröker, "Hydrierung und Dehydrierung, katalytische".

* cited by examiner

*Primary Examiner*—Rena Dye
*Assistant Examiner*—Camie S Thompson
(74) *Attorney, Agent, or Firm*—Jill Denesvich; Godfried R. Akorli

(57) ABSTRACT

The invention relates to layer arrangement having (i) at least one transparent substrate containing an electrically conductive layer, (ii) an electro-optically active layer, and (iii) a further substrate containing an electrically conductive layer, wherein at least one of the two electrically conductive substrates is additionally coated with an organic conductive polymer system and the electro-optically active layer contains an electrophosphorescent compound.

16 Claims, No Drawings

ELECTROPHOSPHORESCENT ARRANGEMENT COMPRISING CONDUCTIVE POLYMERS

BACKGROUND OF THE INVENTION

The present invention relates to a layer arrangement for electro-optical apparatuses that contains an electrophosphorescent material, and electroluminescent arrangements that comprise this layer arrangement.

Electroluminescent arrangements have a wide range of uses, for example, in the production of screens or displays. There has recently been increasing interest in emissive displays and display apparatuses, particularly utilizing electrophosphorescence for increasing the light efficiency yield (cf. Baldo et al., Appl. Phys. Lett., Vol. 75, No. 1, 4, 1999; WO 00/70,655 A2).

Triplet-based emission of light is known by the term phosphorescence (WO 00/70,655 A2). The advantage of phosphorescence over fluorescence is that the major part of triplet-based excitons that are formed by recombination of holes and electrons in an electroluminescent layer are available for energy transfer with luminescence.

In order to ensure as high an efficiency as possible of an emitting arrangement, a tailored layer structure of the electroluminescent arrangement is required. WO 00/70,655 A2 discloses such a layer structure, which, however, is still not optimum both with respect to long-term stability and with respect to the external quantum yield. Thus, for example, a hole injection layer is applied by a vacuum process, i.e., by vapor deposition of a low molecular weight amine, to a substrate which is coated with indium tin oxide (ITO). The inherent roughness of the ITO surface is inevitably transferred to the substrate and is retained thereon. However, even roughness have a very adverse effect during operation of an electroluminescent arrangement since it leads to voltage peaks that result in faster aging and degradation of the layer structure.

WO 00/70,655 A2 describes organic light emitting diodes (OLEDs) that have a hole conductor layer and an electron transport layer. These layers contain compounds, e.g. tris(8-hydroxyquinoline)aluminum ($Alq_3$), which can be applied only by a complicated and expensive vapor deposition process. The much simpler and established processing from solution by means of spin coating, casting methods, or inkjet methods would be desirable.

According to WO 00/70,655 A2, polymer films, such as polycarbonate or other transparent polymers, are used as transparent substrates for the production of the OLEDs. These substrates are provided with a conductive layer, preferably indium tin oxide (ITO). However, the excessively great roughness of the conductive layer, which may lead to short-circuits during operation and to the high level of waste during production, is disadvantageous. As a result of the production, customary inorganic conductive layers on plastic substrates always have greater roughness than on glass. Furthermore, inorganic conductive layers, such as ITO, are brittle, so that cracks occur on the flexible substrates, due to a different coefficient of expansion or extensibility and toughness, and may lead to a break in the electrical conductivity. This occurs in particular during the storage and/or handling of rolled-up substrates, such as, for example, ITO-PET (PET is polyethylene terephthalate) for roll-to-roll processes.

An object of the present invention was therefore the development of novel layer arrangements that permit the emission of light from excited triplet states and that do not have the stated disadvantages.

In order to achieve the object, a layer of an organic conductive polymer system is applied directly to the already present conductive layer (e.g., ITO) of the substrate. By applying the conductive polymer system, surface roughness of the conductive layer on the substrate, particularly on plastic substrates, is compensated. Furthermore, the polymer system covers any cracks present. Through its extensibility and toughness, it ensures that, even after handling of the layer system according to the invention, any cracks present remain covered by conductive paths and the surface conductivity is not broken.

SUMMARY OF THE INVENTION

The invention relates to a layer arrangement comprising (preferably consisting of) (i) at least one transparent substrate containing an electrically conductive layer, (ii) an electro-optically active layer, and (iii) a further substrate containing an electrically conductive layer, wherein at least one of the two electrically conductive substrates is additionally coated with an organic conductive polymer system and the electro-optically active layer contains an electrophosphorescent compound.

DETAILED DESCRIPTION OF THE INVENTION

The layer arrangement according to the invention permits light emission in the form of phosphorescence and, by using an electrically conductive polymer system on a transparent conductive inorganic layer (TCO layer; transparent conductive oxide) on a substrate, prevents short-circuits during operation of OLEDs that contain this layer arrangement.

Electro-optically active layer is understood as meaning a layer which contains an electro-optical compound, i.e., a compound that emits light upon recombination of electrons and holes.

Electrophosphorescent compounds in the context of this Application are compounds that emit light with the phenomenon of phosphorescence upon radiant recombination of electrons and holes. These compounds also exhibit the phenomenon of photoluminescence in the form of phosphorescence upon excitation with light. In contrast to fluorescence, the excitation states that lead to phosphorescence have a longer life. The quantum efficiency of the fluorescence is theoretically limited from the outset by the spin statistics (25% of singlet states that lead to fluorescence, in contrast to 75% of triplet states). For the phosphorescent materials, on the other hand, all excited states can decay with radiation, which is evident from a higher quantum yield.

In a preferred embodiment of the layer arrangement according to the invention, the electrically conductive layer of the transparent substrate is a transparent conductive inorganic layer, the organic conductive polymer system being applied to this layer.

A layer of indium tin oxide is preferably used as the transparent inorganic conductive layer.

Suitable electrophosphorescent compounds are disclosed in WO 00/70,655 A2. For example, phosphorescent organic iridium or osmium compounds can be used.

A preferably used electrophosphorescent compound is fac-tris(2-phenylpyridine)iridium of the formula (I)

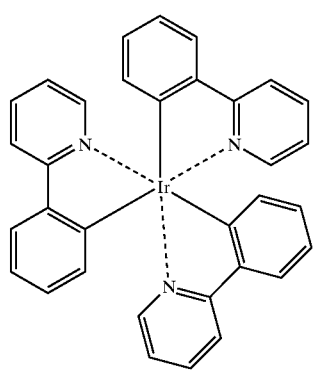

(I)

or substituted derivatives of this parent structure.

Unsubstituted fac-tris(2-phenylpyridine)iridium of the formula (I) is particularly preferably used as the electrophosphorescent compound.

Suitable substituents are, for example, ($C_1$–$C_8$)-alkyl, halogen, cyano (CN), and $CF_3$, it being possible for both the phenyl ring and the pyridine ring of the phenylpyridine ligands to carry one or more identical or different substituents, each phenylpyridine ligand preferably being identically substituted. The substituents are preferably ($C_1$–$C_6$)-alkyl, F, or $CF_3$, particularly preferably F or $CF_3$.

The compounds of the formulas (I-a) and (I-b):

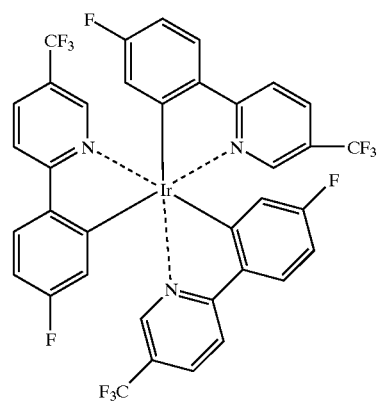

(I-a)

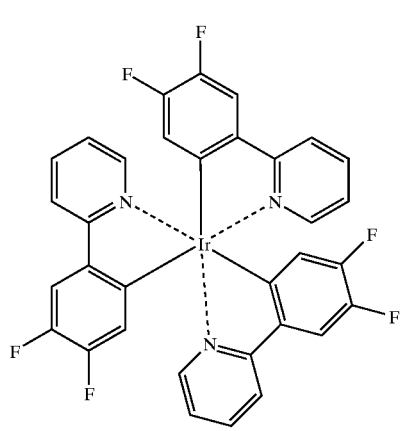

(I-b)

may be mentioned by way of example as substituted derivatives.

Iridium complexes of the general formula (II)

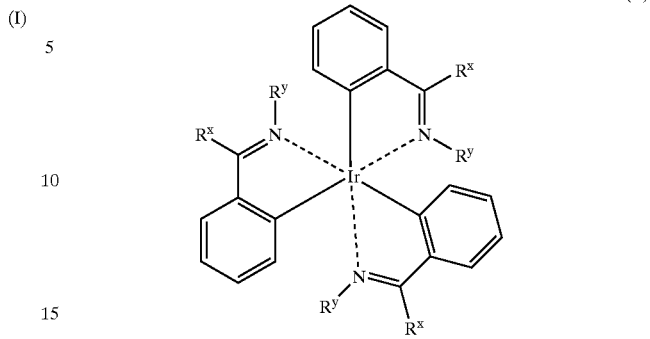

(II)

wherein $R^x$ and $R^y$, independently of one another, representing optionally substituted ($C_1$–$C_8$)-alkyl, optionally substituted ($C_6$–$C_{10}$)-aryl, or ($C_6$–$C_{10}$)-aryl substituted by halogen, can also be used as the electrophosphorescent compound.

$R^x$ and $R^y$, independently of one another, preferably represent ($C_1$–$C_6$)-alkyl, phenyl, or fluorine-substituted phenyl, particularly ($C_1$–$C_6$)-alkyl or phenyl.

The compound of the formula (II-a)

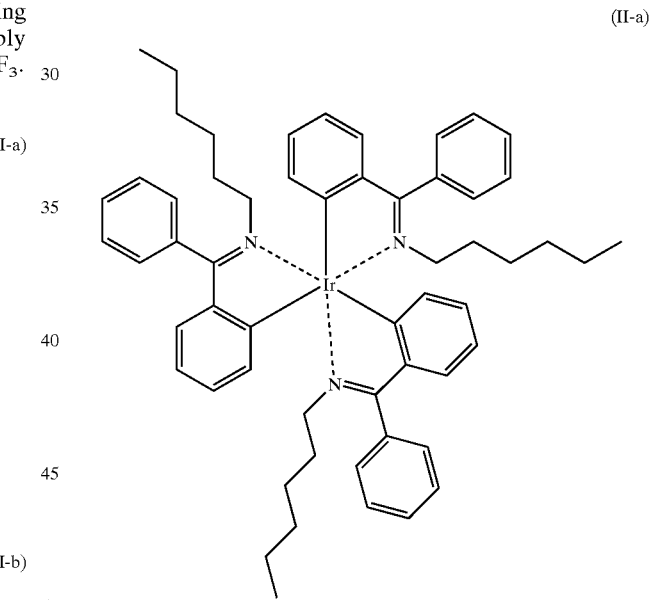

(II-a)

may be mentioned as an example of a suitable iridium complex.

Iridium complexes of the general formula (III)

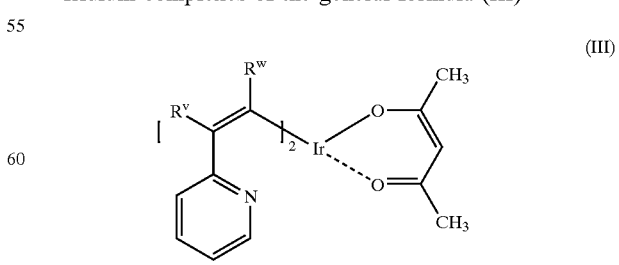

(III)

wherein $R^v$ and $R^w$ together form an aromatic, sulfur-containing heterocycle having 5 or 6 ring atoms, it being possible for further aromatic rings (preferably $C_6$-rings) to be fused onto this heterocycle, are also suitable as the electrophosphorescent compound.

$R^v$ and $R^w$ preferably together form a thiophene ring.

The compound of the formula (III-a)

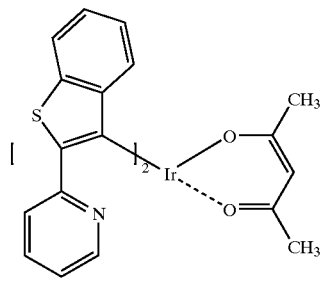

(III-a)

may be mentioned as an example of a suitable iridium complex.

Moreover, iridium complexes of the general formula (IV)

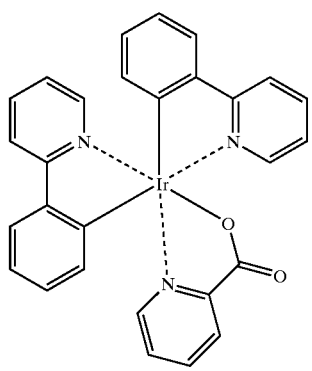

(IV)

which differ from the compounds of the formula (I) by replacement of a phenylpyridine ligand by a pyridine-2-carboxylic acid ligand, can be used as the electrophosphorescent compound.

Phenylpyridine ligands and pyridine-2-carboxylic acid ligand can optionally be substituted. Suitable substituents are, for example, ($C_1$–$C_8$)-alkyl, halogen, cyano (CN), and $CF_3$, it being possible for both the phenyl ring and the pyridine ring of the phenylpyridine ligands and the pyridine ring of the pyridine-2-carboxylic acid ligand to carry one or more identical or different substituents, whereby the phenylpyridine ligands are preferably identically substituted. The substituents are preferably ($C_1$–$C_6$)-alkyl, F, or $CF_3$, particularly preferably F or $CF_3$.

The compound of the formula (IV-a)

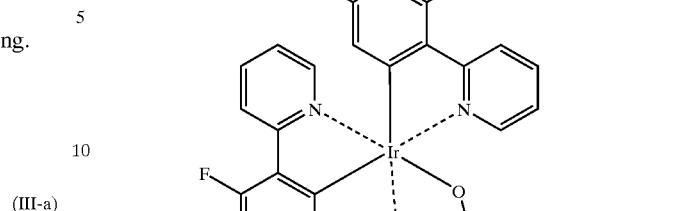

(IV-a)

may be mentioned as an example of a suitable iridium complex of the formula (IV).

The iridium complexes of the formulas (I) to (IV) mentioned can be prepared in a known manner from a suitable iridium compound (preferably iridium(III) acetylacetonate) by ligand exchange.

Some of the ligands are commercially available or can be prepared by customary processes.

The organic conductive polymer system may be, for example, a system based on polyanilines, polypyrroles, or polythiophenes.

The conductive polymer system is understood as meaning a system that may contain further components in addition to the actual organic conductive polymer. It may comprise, for example, film formers, cross-linking agents, thermal solvents, binders, or additives that improve the electrical conductivity. Examples are described in U.S. Pat. No. 5,766,515 or EP-A 602,713.

In a preferred embodiment of the invention, the organic conductive polymer is a cationically charged polythiophene comprising structural units of the formula (V)

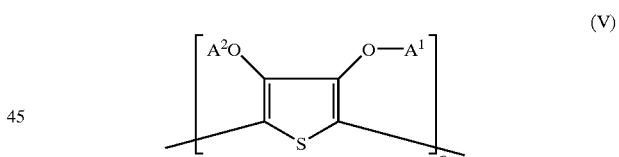

(V)

in which $A^1$ and $A^2$, independently of one another, represent optionally substituted ($C_1$–$C_{18}$)-alkyl or together form optionally substituted ($C_1$–$C_{18}$)-alkylene, and n represents an integer from 2 to 10,000 (preferably from 3 to 5000), in the presence of polyanions.

Particularly preferred cationic polythiophenes are composed of structural units of the formula (Va) or (Vb)

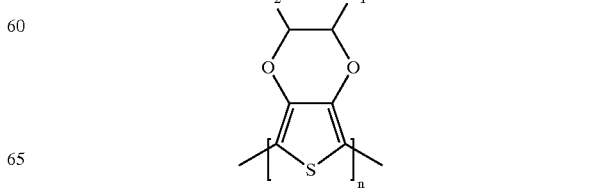

(Va)

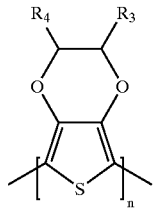

(Vb)

in which

R$_1$ and R$_2$, independently of one another, represent hydrogen, optionally substituted (C$_1$–C$_{18}$)-alkyl (preferably (C$_1$–C$_{10}$)-alkyl, particularly (C$_1$–C$_6$)-alkyl), optionally substituted (C$_2$–C$_{12}$)-alkenyl (preferably (C$_2$–C$_8$)-alkenyl), optionally substituted (C$_3$–C$_7$)-cycloalkyl (preferably cyclopentyl or cyclohexyl), optionally substituted (C$_7$–C$_{15}$)-aralkyl (preferably phenyl-(C$_1$–C$_4$)-alkyl), optionally substituted (C$_6$–C$_{10}$)-aryl (preferably phenyl or naphthyl), optionally substituted (C$_1$–C$_{18}$)-alkyloxy (preferably (C$_1$–C$_{10}$)-alkyloxy, for example, methoxy, ethoxy, or n- or iso-propoxy), or optionally substituted (C$_2$–C$_{18}$)-alkoxyester, and R$_3$ and R$_4$, independently of one another, represent hydrogen, but not both simultaneously hydrogen, (C$_1$–C$_{18}$)-alkyl (preferably (C$_1$–C$_{10}$)-alkyl, particularly (C$_1$–C$_6$)-alkyl), each of which is substituted by at least one sulfonate group, (C$_2$–C$_{12}$)-alkenyl (preferably (C$_2$–C$_8$)-alkenyl), each of which is substituted by at least one sulfonate group, (C$_3$–C$_7$)-cycloalkyl (preferably cyclopentyl or cyclohexyl), each of which is substituted by at least one sulfonate group, (C$_7$–C$_{15}$)-aralkyl (preferably phenyl-(C$_1$–C$_4$)-alkyl), each of which is substituted by at least one sulfonate group, (C$_6$–C$_{10}$)-aryl (preferably phenyl or naphthyl), each of which is substituted by at least one sulfonate group, (C$_1$–C$_{18}$)-alkoxy (preferably (C$_1$–C$_{10}$)-alkoxy, preferably methoxy, ethoxy, or n- or iso-propoxy), each of which is substituted by at least one sulfonate group, or (C$_2$–C$_{18}$)-alkoxyester substituted by at least one sulfonate group, and n represents a number from 2 to 10,000 (preferably from 3 to 5000).

Particularly preferably, R$_3$ and R$_4$, independently of one another, represent hydrogen, but not both simultaneously hydrogen, or one of the above-mentioned radicals, the radical being substituted by a sulfonate group.

Particularly preferred are cationic or neutral polyalkylenedioxythiophenes of the formulas (Va-1) and (Vb-1)

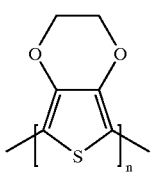

(Va-1)

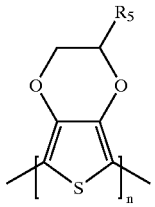

(Vb-1)

in which

R$_5$ represents (C$_1$–C$_{18}$)-alkyl (preferably (C$_1$–C$_{10}$)-alkyl, particularly (C$_1$–C$_6$)-alkyl), each of which is substituted by at least one sulfonate group, (C$_2$–C$_{12}$)-alkenyl (preferably (C$_2$–C$_8$)-alkenyl), each of which is substituted by at least one sulfonate group, (C$_3$–C$_7$)-cycloalkyl (preferably cyclopentyl or cyclohexyl), each of which is substituted by at least one sulfonate group, (C$_7$–C$_{15}$)-aralkyl (preferably phenyl-(C$_1$–C$_4$)-alkyl), each of which is substituted by at least one sulfonate group, (C$_6$–C$_{10}$)-aryl (preferably phenyl or naphthyl), each of which is substituted by at least one sulfonate group, (C$_1$–C$_{18}$)-alkoxy (preferably (C$_1$–C$_{10}$)-alkoxy, for example, methoxy, ethoxy, or n- or iso-propoxy), each of which is substituted by at least one sulfonate group, or (C$_2$–C$_{18}$)-alkoxyester substituted by at least one sulfonate group, and n represents an integer from 1 to 10,000 (preferably from 3 to 5000).

Particularly preferably, R$_5$ represents one of the above-mentioned radicals, the radical being substituted by a sulfonate group.

In a further preferred embodiment of the invention, n in said formulas represents an integer from 4 to 15.

Suitable polyanions are the anions of polymeric carboxylic acids, such as polyacrylic acid, polymethacrylic acids, and polymaleic acids, and polymeric sulfonic acids, such as polystyrenesulfonic acids and polyvinylsulfonic acids. These polycarboxylic and polysulfonic acids may also be copolymers of vinylcarboxylic and vinylsulfonic acids with other polymerizable monomers, such as acrylates and styrene.

The anion of polystyrenesulfonic acid (PSS) is particularly preferred as a counterion.

The molecular weight of the polyacids providing the polyanions is preferably 1000 to 2,000,000, particularly preferably 2000 to 500,000. Polyacids or their alkali metal salts are commercially available (e.g., polystyrenesulfonic acids and polyacrylic acids) or can be prepared by known processes (cf., for example, Houben Weyl, Methoden der organischen Chemie [Methods of organic chemistry], Vol. E 20 Makromolekulare Stoffe [Macromolecular substances], Part 2, (1987), page 1141 et seq.).

Instead of the free polyacids required for the formation of the dispersions from polyalkylenedioxythiophenes and polyanions, it is also possible to use mixtures of alkali metal salts of the polyacids and corresponding amounts of monoacids.

In the case of the formula (Vb-1), the polyalkylenedioxythiophenes carry positive and negative charges in the structural unit.

The preparation of the polyalkylenedioxythiophenes is described, for example, in EP-A 440,957 (counterpart of U.S. Pat. No. 5,300,575). The polyalkylenedioxythiophenes are prepared by oxidative polymerization. They thus acquire positive charges, which are not shown in the formulas since their number and their position cannot be satisfactorily determined.

The polythiophene dispersion can be applied to the transparent conductive substrate by established economical methods, such as casting, printing, spraying, immersion, flooding, or inkjet. No expensive vacuum process is required.

In a preferred embodiment, a hole conductor layer that contains aromatic amine is applied to the electrically conductive polymer system. A list of possible amines is given in EP-A 532,798.

An aromatic amine of the formula (VI) is preferably used

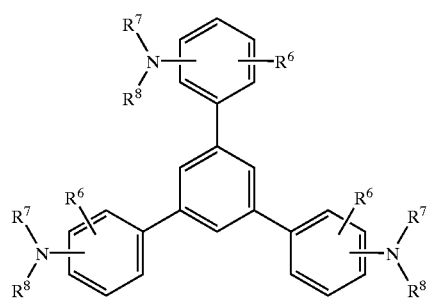

(VI)

in which $R^6$ represents hydrogen, optionally substituted alkyl, or halogen, and $R^7$ and $R^8$, independently of one another, represent optionally substituted $(C_1-C_{10})$-alkyl, alkoxycarbonyl-substituted $(C_1-C_{10})$-alkyl, or aryl, aralkyl, or cycloalkyl, each of which is optionally substituted.

Preferably, $R^7$ and $R^8$, independently of one another, preferably represent $(C_1-C_6)$-alkyl (particularly methyl, ethyl, n- or iso-propyl, or n-, iso-, sec-, or tert-butyl), $(C_1-C_4)$-alkoxycarbonyl-$(C_1-C_6)$-alkyl (such as, for example, methoxy-, ethoxy-, propoxy-, or butoxycarbonyl-$(C_1-C_4)$-alkyl), or phenyl-$(C_1-C_4)$-alkyl, naphthyl-$(C_1-C_4)$-alkyl, cyclopentyl, cyclohexyl, phenyl, or naphthyl, each of which is optionally substituted by $(C_1-C_4)$-alkyl and/or $(C_1-C_4)$-alkoxy.

Particularly preferably, $R^7$ and $R^8$, independently of one another, represent unsubstituted phenyl or naphthyl or represent phenyl or naphthyl, each of which is monosubstituted to trisubstituted by methyl, ethyl, n- or iso-propyl, methoxy, ethoxy, or n- and/or iso-propoxy.

$R^6$ preferably represents hydrogen, $(C_1-C_6)$-alkyl, such as, for example, methyl, ethyl, n- or iso-propyl or n-, iso-, sec-, or tert-butyl, or chlorine.

Such compounds and their preparation are described, for use in electrophotography, in U.S. Pat. No. 4,923,774, which is hereby expressly incorporated by reference. The tris-nitrophenyl compound can be converted into the tris-aminophenyl compound, for example, by generally known catalytic hydrogenation, for example, in the presence of Raney nickel (Houben-Weyl 4/1C, 14–102, Ullmann (4) 13, 135–148). The amino compound is reacted with substituted halogenobenzenes in a generally known manner.

The following compounds may be mentioned by way of example:

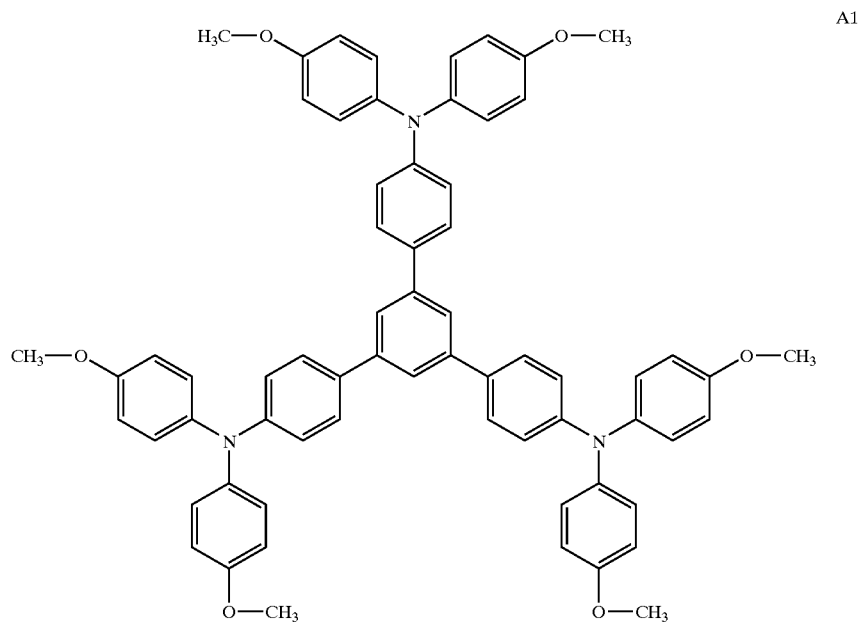

A1

-continued

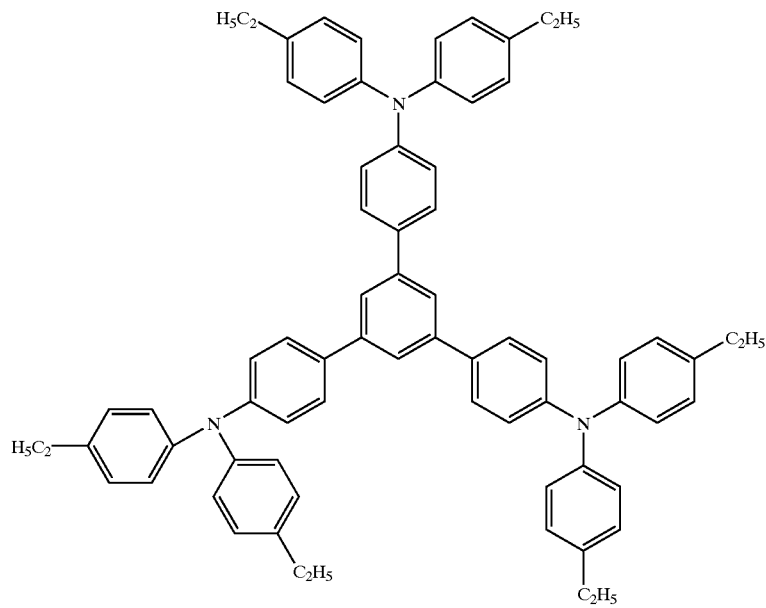

A2

In addition to the tertiary amino compound, further hole-conductors, e.g., in the form of a mixture with the tertiary amino compound, can optionally be used for producing the electroluminescent element. This may comprise, on the one hand, one or more compounds of the formula (VI), mixtures of isomers also being included, and, on the other hand, also mixtures of hole-transporting compounds with tertiary amino compounds (i.e., having the general formula (VI)) having a different structure.

A list of possible hole-conducting materials is given in EP-A 532,798.

In the case of mixtures of the aromatic amines, the compounds can be used in any desired ratio.

Materials that have hole-conducting properties and can be used in pure form or as a partner for the tertiary amino compounds in the mixture are, for example, the following compounds,

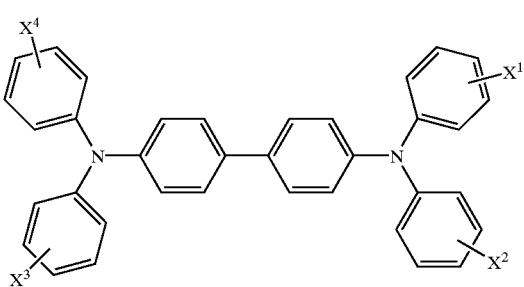

-continued

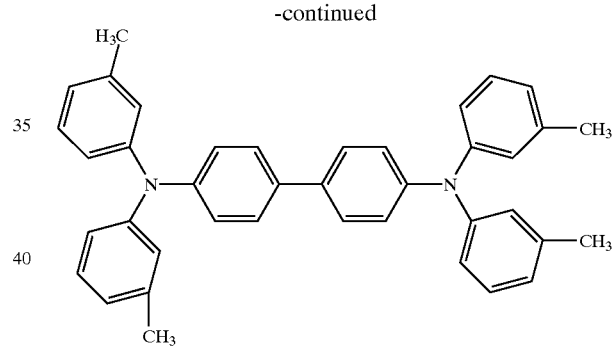

wherein $X^1$ to $X^4$, independently of one another, represent H, halogen, alkyl, aryl, alkoxy, or aryloxy.

Preferably, the layer arrangement according to the invention additionally comprises an electron transport layer. A large number of compounds that are suitable for use in such a layer is already known.

Thus, according to WO 00/70,655 A2, for example, Alq$_3$ is used. This compound is a pigment that, due to its insolubility in customary solvents, can be applied exclusively by a vapor deposition process.

A gallium complex from the group consisting of Ga(qa)$_2$OR$^9$, Ga(qa)$_2$OCOR$^9$, or Ga(qa)$_2$—O—Ga(qa)$_2$, wherein R$^9$ represents substituted or unsubstituted alkyl, aryl, arylalkyl, or cycloalkyl, and (qa) represents

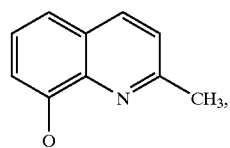

is preferably used for the production of the electron transport layer.

In contrast to Alq₃, these gallium compounds can be processed both from solution and by vapor deposition methods. Suitable solvents are, for example, methanol, ethanol, n-propanol, or iso-propanol.

$R^9$ preferably represents optionally branched alkyl that is unsubstituted or substituted by halogen or cyano, particularly represents optionally branched ($C_1$–$C_8$)-alkyl that is unsubstituted or substituted by halogen or cyano, and particularly preferably represents optionally branched ($C_1$–$C_6$)-alkyl that is unsubstituted or substituted by halogen or cyano. Fluorine and chlorine are preferred as halogen.

Gallium compounds of the formulas (VII) to (IX) are particularly preferably used.

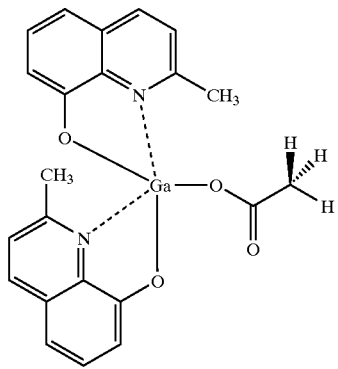

(VII)

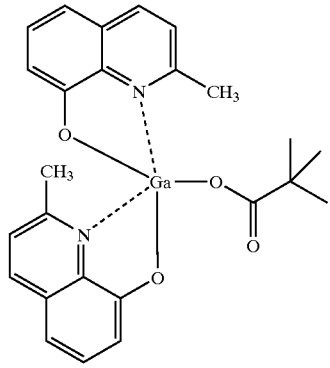

(VIII)

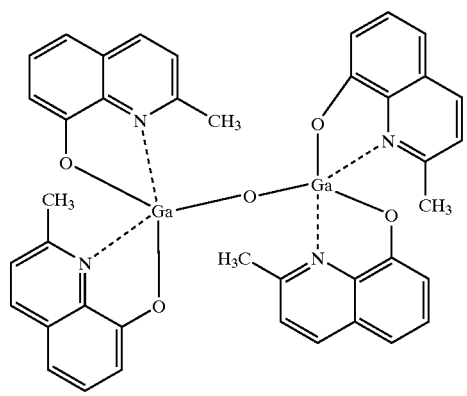

(IX)

The barrier layer preferably contains bathocuproin (X).

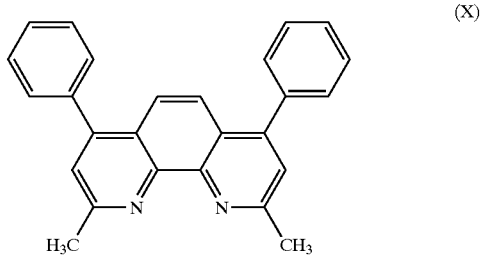

(X)

Glass, very thin glass (flexible glass), and plastics are suitable as a transparent substrate that is provided with a conductive layer.

Particularly suitable plastics are polycarbonates, polyesters, copolycarbonates, polysulfone, polyethersulfone, polyimide, polyethylene, polypropylene, cyclic polyolefins, cyclic olefin copolymers (COC), hydrogenated styrene polymers, or hydrogenated styrene copolymers.

Preferred polymers are polycarbonates, polyesters, polysulfone, polyethersulfone, cyclic olefin copolymers, hydrogenated styrene polymers, and hydrogenated styrene copolymers. From the group consisting of the polyesters, PET and PEN (polyethylene terephthalate and polyethylene naphthenate, respectively) are preferred.

Suitable polymer substrates are, for example, polyester films, PES films from Sumitomo or polycarbonate films from Bayer AG (Makrofol®).

These substrates can be made scratch-resistant and/or resistant to chemicals by an additional layer, e.g., Marnot® films (Bayer AG).

Particularly suitable from the group consisting of the polycarbonates are the poly- or copolycarbonates that contain one of the following segments:

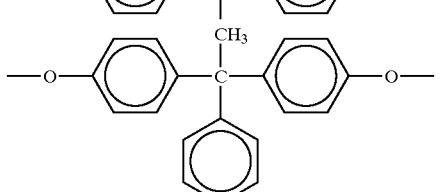

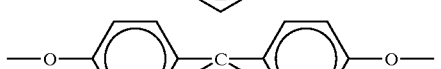

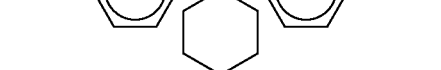

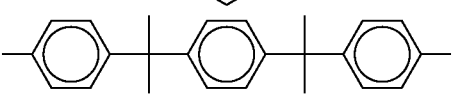

and/or

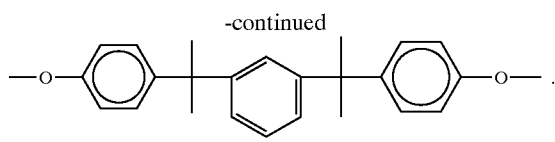

Further bisphenols for the synthesis of polycarbonates are described, for example, in EP-A 359,953.

The layer arrangement according to the invention may be encapsulated.

The layer arrangement according to the invention is particularly suitable as an electroluminescent apparatus. Accordingly, electroluminescent apparatuses that contain a layer arrangement according to the invention are likewise a subject of the invention.

The layer arrangement according to the invention can be produced, for example, as follows: An organic electrically conductive polymer is applied in the form of a solution or dispersion to a substrate provided with an electrically conductive coating of an indium tin oxide layer (ITO layer). A subsequent heating process serves for removing the solvent fractions. The preferably used amines of the formula (VI) are then applied to the layer of the organic conductive polymer system, likewise in the form of a wet coating step. A heating step for removing the solvent is effected here, too. A subsequent electro-optically active layer and optionally a barrier layer are applied by a vapor deposition process.

A subsequent electron transport layer comprising a gallium complex compound is now applied to the electro-optically active layer or the barrier layer, preferably once again from a solution (for example, in methanol). The advantage of the layer structure according to the invention thus also consists in the substantial reduction in the necessary high-vacuum coating steps during the production of all organic functional layers.

For the production of an electroluminescent arrangement, for example, a metal substrate that serves as a cathode can then be applied. The ITO layer acts as the anode.

The following examples further illustrate details for the preparation and use of this invention. The invention, which is set forth in the foregoing disclosure, is not to be limited either in spirit or scope by these examples. Those skilled in the art will readily understand that known variations of the conditions and processes of the following preparative procedures can be used to prepare these compositions. Unless otherwise noted, all temperatures are degrees Celsius and all percentages are percentages by weight.

EXAMPLES

Application of a Conductive Polythiophene Layer (Baytron®P)

Application of Baytron® P Layer to ITO:

About 10 ml of a poly(ethylenedioxythiophene)/polystyrenesulfonic acid solution having a solids content of about 1.2% by weight (BAYER AG, Leverkusen, Baytron® P) were filtered (Millipore HV, 0.45 μm). A substrate was then placed on a spin coater and the filtered solution was distributed over the ITO-coated side of the substrate. The supernatant solution was then applied by spin coating by rotating the disc at 500 rpm over a period of 3 min. The substrate thus coated was then dried for 5 min at 110° C. on a hotplate. The layer thickness was 60 nm (determined by means of Tencor, Alphastep 200).

Table 1 shows the effect of the Baytron®P solution on the surface roughness of the substrate.

TABLE 1

| Substrate | Center line average value $r_a$ (nm) |
|---|---|
| a) Glass/ITO | 2.5 |
| b) Glass/ITO/Baytron ® P | 1.6 |
| c) Polyester (PET)IITO | 3.9 |
| d) Polyester (PET)/ITO/Baytron ® P | 2.5 |

Roughness was determined with the aid of atomic force microscopy (AFM).

The smoothing effect exerted by the conductive layer on the substrate surface is clearly evident. The sample d) has no visible surface cracks even after repeated mechanical treatment bending, rolling, etc. The Baytron®P-coated substrate can be used for producing electro-optically active arrangements, such as, for example, electrophosphorescent displays.

What is claimed is:

1. A layer arrangement comprising (i) at least one transparent substrate containing an electrically conductive layer, (ii) an electro-optically active layer, arid (iii) a further substrate containing an electrically conductive layer, wherein at least one of the two electrically conductive substrates is additionally coated with an organic conductive polymer system and the electro-optically active layer contains an electrophosphorescent compound, wherein the organic conductive polymer system is a cationically charged polythiophene comprising structural units of the formula (V)

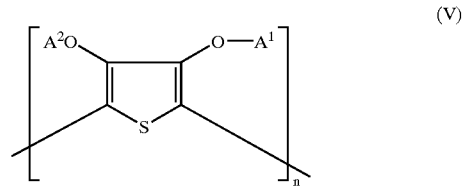

(V)

in which $A^1$ and $A^2$, independently of one another, represent optionally substituted $(C_1-C_{18})$-alkyl or together form optionally substituted $(C_1-C_{18})$-alkylene, and n represents an integer from 2 to 10,000, in the presence of polyanions.

2. A layer arrangement according to claim 1 wherein the electrically conductive layer of the transparent substrate is a transparent conductive inorganic layer and the organic conductive polymer system is applied to the transparent conductive inorganic layer.

3. A layer arrangement according to claim 2 wherein the transparent inorganic conductive layer comprises indium tin oxide.

4. A layer arrangement comprising (i) at least one transparent substrate containing an electrically conductive layer, (ii) an electro-optically active layer, and (iii) a further substrate containing an electrically conductive layer, wherein at least one of the two electrically conductive substrates is additionally coated with an organic conductive polymer system and the electro-optically active layer contains an electrophosphorescent compound, wherein the organic conductive polymer system is a cationically charged polythiophene comprising structural units of the formula (V)

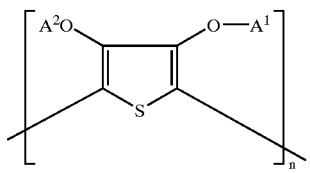

(V)

in which

A¹ and A², independently of one another, represent optionally substituted ($C_1$–$C_{18}$)-alkyl or together form optionally substituted ($C_1$–$C_{18}$)-alkylene, and n represents an integer from 2 to 10,000, in the presence of polyanions, wherein the electrophosphorescent compound is a phosphorescent organic iridium or osmium compound.

5. A layer arrangement according to claim 4 wherein the electrophosphorescent compound is a phosphorescent organic indium compound of the formula

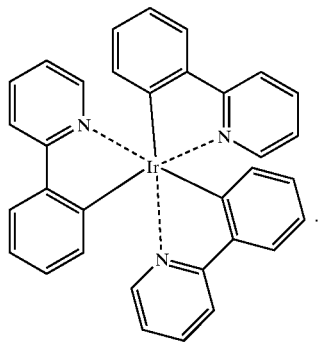

(I)

6. A layer arrangement according to claim 1 wherein the organic conductive polymer system is a polyaniline, a polypyrrole, or a polythiophene system.

7. A layer arrangement comprising (i) at least one transparent substrate containing an electrically conductive layer, (ii) an electro-optically active layer, and (iii) a further substrate containing an electrically conductive layer, wherein at least one of the two electrically conductive substrates is additionally coated with an organic conductive polymer system and the electro-optically active layer contains an electrophosphorescent compound, wherein the organic conductive polymer system is a cationically charged polythiophene comprising structural units of the formula (V)

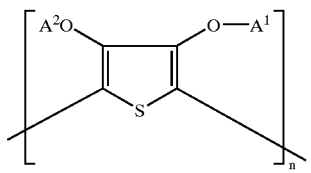

(V)

in which

A¹ and A², independently of one another, represent optionally substituted ($C_1$–$C_{18}$)-alkyl or together form optionally substituted ($C_1$–$C_{18}$)-alkylene, and n represents an integer from 2 to 10.000, in the presence of polyanions, wherein a hole conductor layer that contains an aromatic amine of the formula (VI)

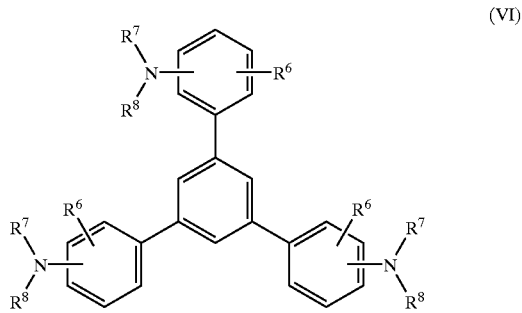

(VI)

in which $R^6$ represents hydrogen, optionally substituted alkyl, or halogen, and $R^7$ and $R^8$, independently of one another, represent optionally substituted ($C_1$–$C_{10}$)-alkyl, alkoxycarbonyl-substituted ($C_1$–$C_{10}$)-alkyl, or aryl, aralkyl or cycloalkyl, each of which is optionally substituted, is additionally applied to the electrically conductive polymer system.

8. A layer arrangement comprising (i) at least one transparent substrate containing an electrically conductive layer, (ii) an electro-optically active layer, and (iii) a further substrate containing an electrically conductive layer, wherein at least one of the two electrically conductive substrates is additionally coated with an organic conductive polymer system and the electro-optically active layer contains an electrophosphorescent compound, wherein the organic conductive polymer system is a cationically charged polythiophene comprising structural units of the formula (V)

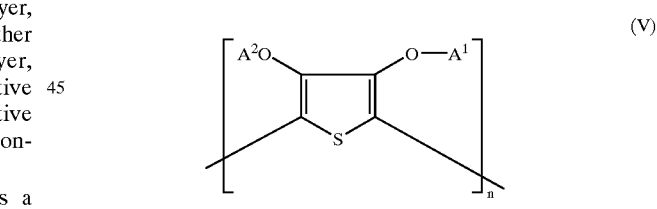

(V)

in which

A¹ arid A², independently of one another, represent on optionally substituted ($C_1$–$C_{18}$)-alkyl or together form optionally substituted ($C_1$–$C_{18}$)-alkylene, and n represents an integer from 2 to 10,000, in the presence of polyanions; and an electron transport layer that contains a gallium complex selected from the group consisting of Ga(qa)$_2$OR$^9$, Ga(qa)$_2$OCOR$^9$, or Ga(qa)$_2$—O—Ga(qa)$_2$, in which $R^9$ represents substituted or unsubstituted alkyl, aryl, aralkyl, or cycloalkyl, and (qa) represents

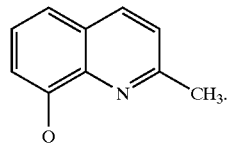

9. A layer arrangement according to claim 1 wherein the transparent substrate is glass or a plastic.

10. A layer arrangement according to claim 1 wherein at least one of the two substrates is a plastic substrate.

11. A layer arrangement according to claim 9 wherein the plastic is a polycarbonate, copolycarbonate, polyester, polysulfone, polyethersulfone, polyimide, polypropylene, polyethylene, cyclic polyolefin, cyclic olefin copolymer, hydrogenated styrene polymer, or hydrogenated styrene copolymer.

12. A layer arrangement according to claim 10 wherein the plastic is a polycarbonate, copolycarbonate, polyester, polysulfone, polyethersulfone, polyimide, polypropylene, polyethylene, cyclic polyolefin, cyclic olefin copolymer, hydrogenated styrene polymer, or hydrogenated styrene copolymer.

13. A layer arrangement according to claim 9 wherein the plastic substrate is at least one of scratch-resistant end resistant to chemicals.

14. A layer arrangement according to claim 10 wherein the plastic substrate is at least one of scratch-resistant and resistant to chemicals.

15. A layer arrangement according to claim 1 wherein the arrangement is encapsulated.

16. An electroluminescent apparatus containing a layer arrangement according to claim 1.

* * * * *